(12) United States Patent
Zhang

(10) Patent No.: US 10,492,277 B2
(45) Date of Patent: Nov. 26, 2019

(54) MUSICAL BEAT DETECTION SYSTEM AND METHOD FOR LIGHTING CONTROL

(71) Applicant: Michael Weibin Zhang, Hong Kong (CN)

(72) Inventor: Michael Weibin Zhang, Hong Kong (CN)

(73) Assignee: Fourstar Group Inc., Taipei (TW)

( * ) Notice: Subject to any disclaimer, the term of this patent is extended or adjusted under 35 U.S.C. 154(b) by 0 days.

(21) Appl. No.: 16/213,102

(22) Filed: Dec. 7, 2018

(65) Prior Publication Data

US 2019/0182932 A1 Jun. 13, 2019

Related U.S. Application Data

(60) Provisional application No. 62/609,442, filed on Dec. 22, 2017.

(51) Int. Cl.
| | |
|---|---|
| H05B 33/00 | (2006.01) |
| H05B 37/02 | (2006.01) |
| G10L 25/51 | (2013.01) |
| H05B 33/08 | (2006.01) |
| H03F 3/68 | (2006.01) |
| H03F 3/183 | (2006.01) |

(52) U.S. Cl.
CPC ......... H05B 37/0236 (2013.01); G10L 25/51 (2013.01); H03F 3/183 (2013.01); H03F 3/68 (2013.01); H05B 33/0854 (2013.01); *G10H 2210/076* (2013.01); *H03F 2200/03* (2013.01); *H03F 2200/267* (2013.01)

(58) Field of Classification Search
CPC ............ H05B 33/0857; H05B 33/0803; H05B 33/0818; H05B 37/029; H05B 33/0827; H05B 33/0863; H05B 37/02; H05B 37/0254; H05B 33/0815; H05B 33/0842; H05B 33/0869; H05B 33/0872; H05B 33/0896
See application file for complete search history.

(56) References Cited

U.S. PATENT DOCUMENTS

| | | | |
|---|---|---|---|
| 6,166,496 | A | 12/2000 | Lys et al. |
| 6,577,080 | B2 | 6/2003 | Lys et al. |
| 7,926,978 | B2 | 4/2011 | Tsai |
| 8,397,381 | B2 | 3/2013 | Tsai |
| 8,614,632 | B1 | 12/2013 | Wells et al. |
| 2019/0132928 | A1* | 5/2019 | Rodinger ................ F21S 2/005 |

FOREIGN PATENT DOCUMENTS

CN          1514498          7/2004

* cited by examiner

*Primary Examiner* — Monica C King
(74) *Attorney, Agent, or Firm* — Salter & Michaelson

(57) ABSTRACT

A system for controlling a plurality of light sources particularly LED's that are provided in a number of different arrangements including a light string and controlled from a controller that includes an input microphone for detecting an audio signal, at least one pre-amplifier, a microcomputer unit receiving signals from the pre-amplifier, and a circuit for driving a plurality of LED and that enables lighting control of the plurality of LED's in accordance with the input audio signal and within a wide dynamic range.

4 Claims, 13 Drawing Sheets

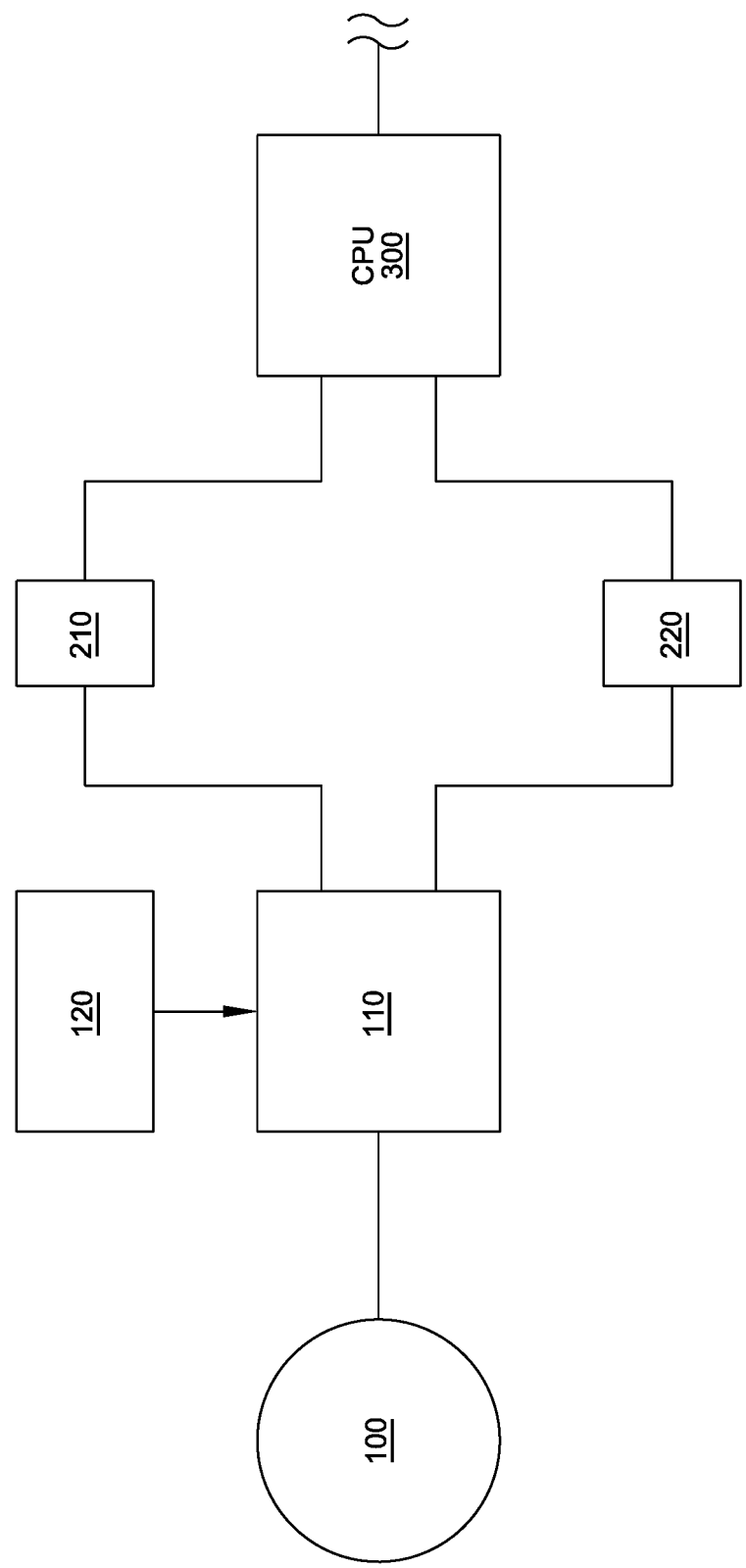

MUSICAL BEAT DETECTION SYSTEM AND METHOD FOR LIGHTING CONTROL

RELATED CASES

Priority for this application is hereby claimed under 35 U.S.C. § 119(e) to commonly owned and U.S. Provisional Patent Application No. 62/609,442 which was filed on Dec. 22, 2017 and which is incorporated by reference herein in its entirety.

FIELD OF THE INVENTION

The present invention relates in general to an apparatus or device for analyzing the beats of music in a musical piece in order to control a lighted or illuminated object. More particularly, the present invention relates to a novel musical beat detection system that enables lighting control within a wide dynamic range. The present invention also relates to a beat detection system that enables lighting control of an illuminated object and that can be implemented quite inexpensively with little or no complexity. The present invention still further relates to a beat detection system that enables lighting control of an illuminated object, and in which the object has a wide variety of uses such as for holiday, party, and decorative lighting products.

BACKGROUND OF THE INVENTION

The present invention has come about in order to provide a method and system that improves any presently known products. One of the reasons why a consumer grade sound-activated light string is not widely available in the market is that the existing products are not affective enough for their desired purpose. Furthermore performance products that are effective usually come at a high cost and are thus only suitable for professional or commercial usage.

In existing systems, a relatively expensive low-pass filter is needed to extract the low frequency audio signal. In other software systems, a standard DSP algorithm such as FFT is required in order to analyze the low frequency audio signal. This requires a relatively powerful and expensive microcomputer unit (MCU). Most existing systems work for music sources with a fairly stable volume level, such as the output of a CD player. Some systems that use a microphone as input can only work for loud music. Some systems using sensitive microphones can work with low volume music but when the volume is high they do not work properly.

Accordingly, it is an object of the present invention to provide a unique and advanced method of control of the lighting, especially for low cost applications.

Still another object of the present invention is to provide a novel musical beat detection system that enables lighting control within a wide dynamic range.

Another object of the present invention is to provide a beat detection system that enables lighting control of an illuminated object and that can be implemented quite inexpensively with little or no complexity.

Still a further object of the present invention is to provide a beat detection system that enables lighting control of an illuminated object, and in which the object has a wide variety of uses such as for holiday, party, and decorative lighting products.

SUMMARY OF THE INVENTION

In accordance with one aspect of the present invention, there is provided a circuit or device for causing a light source or object to flash in correspondence with certain sound signals received, such as the peak amplitude of a received sound signal. The circuit comprises a sensitive sound input microphone and a two-stage pre-amplifier, a microcomputer unit (MCU), an LED driver, and an array of LED lights. With the beat detection system of the present invention that enables lighting control of an illuminated object, there is provided a low-cost sound-activated lighting concept that is characterized by high-performance and that is visually attractive.

In accordance with the present invention there is provided a system for controlling a plurality of light sources particularly LED's that are provided in a number of different arrangements including a light string and controlled from a controller that includes an input microphone for detecting an audio signal. The system further includes at least one pre-amplifier, a microcomputer unit receiving signals from the pre-amplifier, and a circuit for driving a plurality of LED and that enables lighting control of the plurality of LED's in accordance with the input audio signal and within a wide dynamic range.

In accordance with other aspects of the present invention the system includes means for adjusting the threshold parameters; time threshold [TTH] and a predetermined and preferably fixed threshold [BTH] based upon the audio tempo [TP]; adjusting TTH based upon audio signal magnitude [M]; including first and second series-connected pre-amplifiers and changing pre-amplifiers as an input to the microcomputer unit [MCU], based upon the level of sensed magnitude M and/or the level of tempo T;

In accordance with another version of the present invention there is provided a method for controlling lighting by an audio signal, including:
  receiving audio signals and amplifying said audio signals;
  detecting any waveform with a level greater than a predefined level threshold and calculate the lasting time (T1) of the detected waveform;
  comparing the lasting time T1 to a predefined time threshold (TTH), and if greater then keep the waveform as one bass waveform, or otherwise discard the waveform;
  counting the number of bass waveforms within a predefined time window BTW to determine a bass beat; and
  using the bass beat to control lighting.

In accordance with other aspects of the present invention the method includes receiving the audio signals using a microphone; adjusting the threshold parameters TTH and BTH based upon tempo TP; adjusting threshold TTH based upon audio signal magnitude M; providing first and second series-connected pre-amplifiers and changing pre-amplifiers as an input to the MCU, based upon the level of sensed magnitude M and/or the level of tempo T; providing the pair of first and second preamplifiers as connected in series; wherein, in a first mode of operation, both preamplifiers provide additive amplification of the input audio signal, and wherein, in a second mode or operation, only the first preamplifier provides amplification of the input audio signal.

In accordance with still another version of the present invention there is provided a system for lighting control using sound, comprising:
  a microphone for receiving audio signals,
  a preamplifier for amplifying said audio signals,
  a controller for detecting bass beat information from said audio signals and adjusting beat information in order to control lights,
  a light driver for driving the lights, and
  lights driven from the light driver.

In accordance with other aspects of the present invention there is provided means for adjusting the threshold parameters TTH and BTH based upon tempo TP; means for adjusting TTH based upon audio signal magnitude M; including first and second series-connected pre-amplifiers and changing pre-amplifiers as an input to the MCU, based upon the level of sensed magnitude M and/or the level of tempo T; including the pair of first and second preamplifiers as connected in series; wherein, in a first mode of operation, both preamplifiers provide additive amplification of the input audio signal; wherein, in a second mode or operation, only the first preamplifier provides amplification of the input audio signal; wherein the lights comprise a plurality of LED's connected in a light string.

BRIEF DESCRIPTION OF THE DRAWINGS

It should be understood that the drawings are provided for the purpose of illustration only and are not intended to define the limits of the disclosure. The foregoing and other objects and advantages of the embodiments described herein will become apparent with reference to the following detailed description when taken in conjunction with the accompanying figures:

FIG. 13 is a simplified block diagram of an alternate arrangement wherein the pre-amplifiers are connected in parallel.

ADVANTAGES OF THE PRESENT INVENTION

Figure 1:
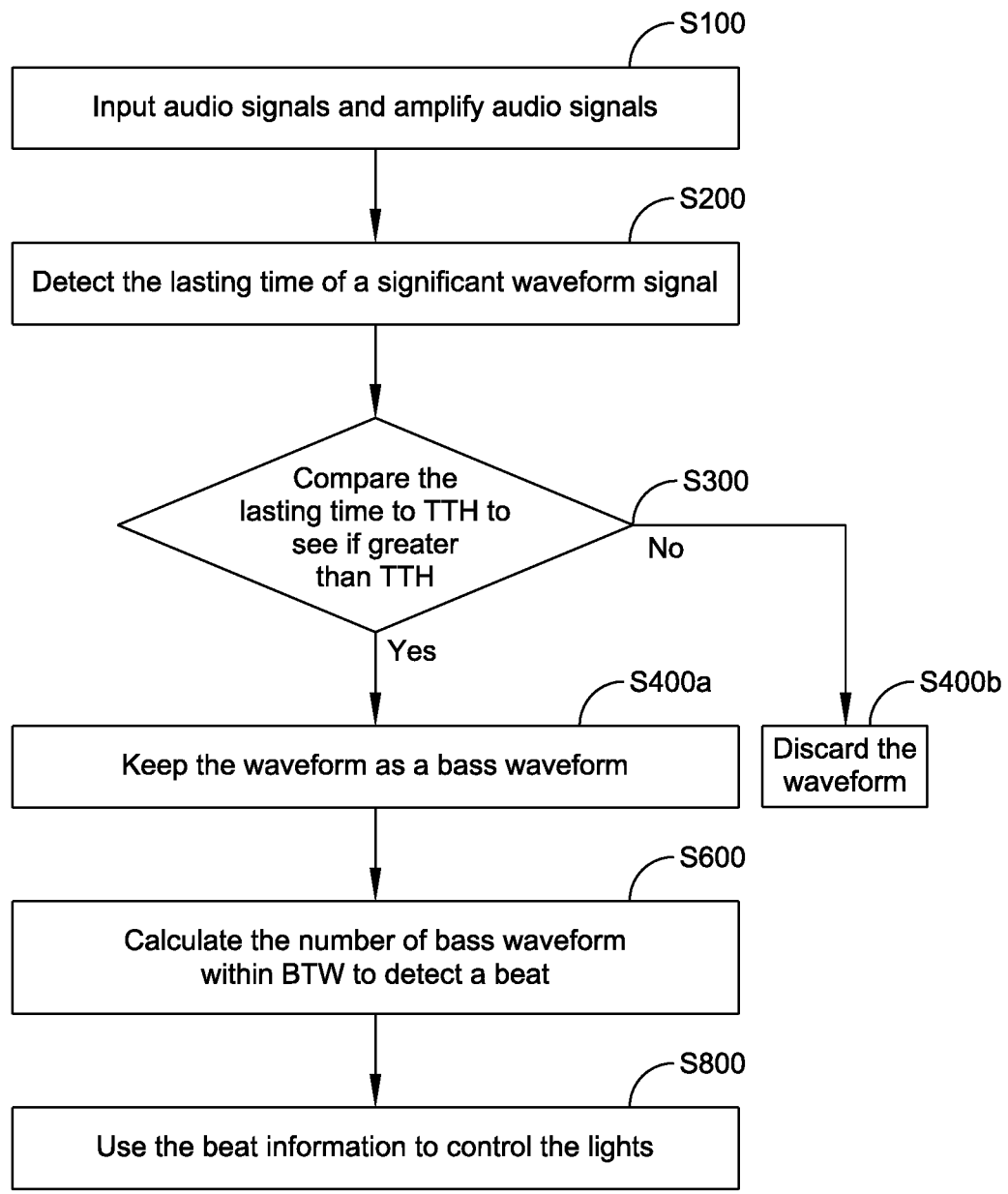
FIG. 1 is a general block diagram and flow chart that describe algorithms of the present invention.

The following are some advantages of the system and method of the present invention particularly in comparison to other existing systems:

1) High sensitivity. Using a sensitive microphone and a two-stage pre-amplifier, the sensitivity is as high as 65 db.

2) Wide dynamic range. The dynamic range is from 65 db to 110 db. The lighting effects are still accurate even when the loudness of the music being played is very high. Some existing products can only react properly to sound in a narrow range. For example, if they can react to low volume sound properly, they will not react accurately to sound in a high volume.

3) Accurate beat analysis. The beat detection system of the present invention detects primarily only the bass of music (instead of the treble) and uses that as the beat information to change the lighting pattern. When there are both normal sound (above bass) and bass sound mixed, the bass beat is detected and used to drive the lighting pattern.

4) Dynamic light show. Both the musical beat and magnitude information is used to change the lighting pattern and chase, as well as the color and brightness. The lighting is modified in a way that is beautiful, musical, emotional and interesting.

PARTICULARS OF THE PRESENT INVENTION

The present invention provides for a beat detection system that enables lighting control of an illuminated object and that can be implemented quite inexpensively with little or no complexity, and in which the object has a wide variety of uses such as for holiday, party, and decorative lighting products. The object may be in the form of a sphere in which there are disposed a plurality of controlled LED's. Another form of the lighting system is one in which a light string is employed that included a plurality of separate LED's that are connected in a spaced apart manner and connected by electrical wiring between all LED's.

In accordance with the present invention the control circuit is basically comprised of a microphone which is preferably a high sensitivity microphone, an amplifier module, a microcomputer unit, an LED driver, and LED lights. The amplifier module is preferably constructed of a pair of pre-amplifiers that are fed to the microcomputer unit MCU in order to achieve a wide dynamic range. A control algorithm is used to detect the low frequency signal by analyzing the timing of the input audio waveform. In accordance with the present invention there are considered to be two steps in using sound to control lighting. The first step is to analyze the audio signals and extract certain useful information such as magnitude, beat, and tempo. The second step is to use this information to control the lights. The first step of analyzing is one step involved in the present invention. The first step involves such parameters as Beat (B), magnitude (M), tempo (TP) that are used to trigger, modify, set, and change the lights' attributes.

The system of the present invention is adaptive. It changes some parameters automatically to be adapted to a wide dynamic range of audio signals. To achieve a wide dynamic range, it chooses automatically the output of the first stage pre-amplifier as an input to the MCU for low volume music, and chooses the second stage pre-amplifier as an input to the MCU for high volume music. The magnitude of the audio signal is also detected. Both the beat and magnitude information is used to change the lighting effects. When the music has little or no perceivable bass beat, the lighting effect will change according to the magnitude of the sound and essentially override the control based on "bass" detection. The beat detection system of the present invention that enables lighting control of an illuminated object needs only low computing power and memory. So it does not require a powerful MCU. The low cost MCU can also be used to control the LED lights via the driver by means of PWM (pulse wide modulation).

The following provides steps in accordance with the method of the present invention and the associated parameters. The MCU provides the following controls.

1) Analyzes the detected audio waveform via the sensitive microphone in order to find low frequency signals. A time threshold (TTH) is set. Any wave cycle longer than TTH is treated as bass cycles. The number of bass cycles (NB) is accumulated for a time window (BTW). When the number of bass cycles (NB) is greater than a predefined threshold (BTH), a beat (B) is found. The tempo (TP) is also calculated for a tempo time window (TTW). Tempo can be measure in beats per minute (BPM).

2) The respective thresholds TTH and BTH are adjusted according to the tempo (TP) so that the TP is not too high or too low. Because the beat information is used to change lighting effects, the TP should be within a certain range for the lights to change in an acceptable way; not too fast, or not too slow. In other words, TP is not necessarily a strict tempo value. It is more for the lighting instead of music. When TP is too high, BTH is raised so as to reduce TP. When TP is too low, BTH is reduced so as to increase TP. So TP is always within a certain range.

3) The magnitude (or energy) information (M) is also accumulated for each BTW. If M is high, TTH is adjusted higher. If M is low, TTH is adjusted lower. This will help to work with different volume for a wide dynamic range.

4) The default input is from the second stage pre-amplifier. When M and TP are too high, the input is switched to the first pre-amplifier. This is to achieve a wider dynamic range.

5) Beat (B), magnitude (M), tempo (TP) are used to trigger, modify, set, and change the lights' attributes. The attributes include brightness, color, type, pattern, and chase.

DETAILED DESCRIPTION

Figure 2:
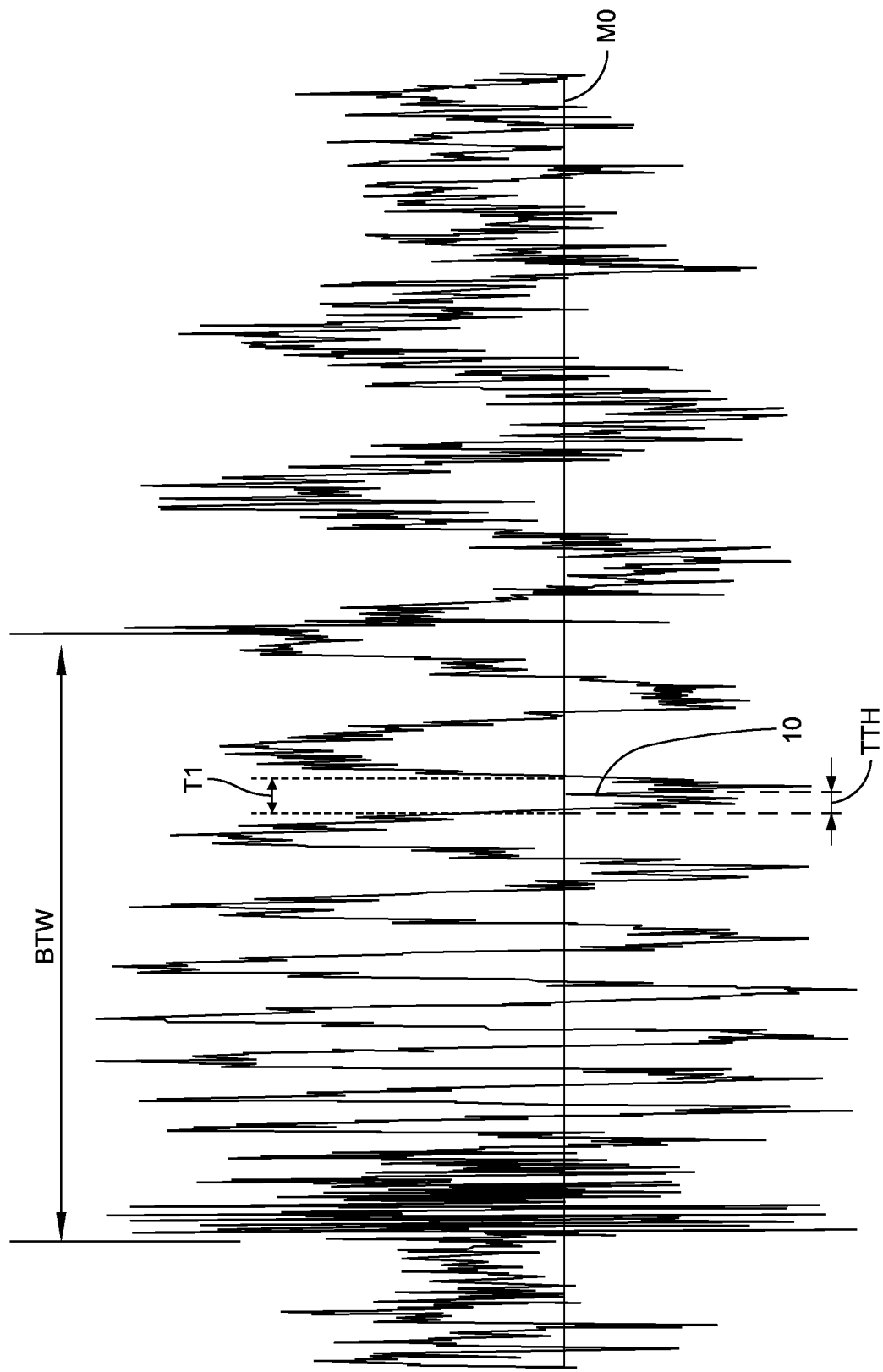
FIG. 2 is an audio signal waveform of one of the steps indicated in FIG. 1 and that is helpful in understanding the concepts of the present invention as it relates to the time window (BTW)
Figure 3:
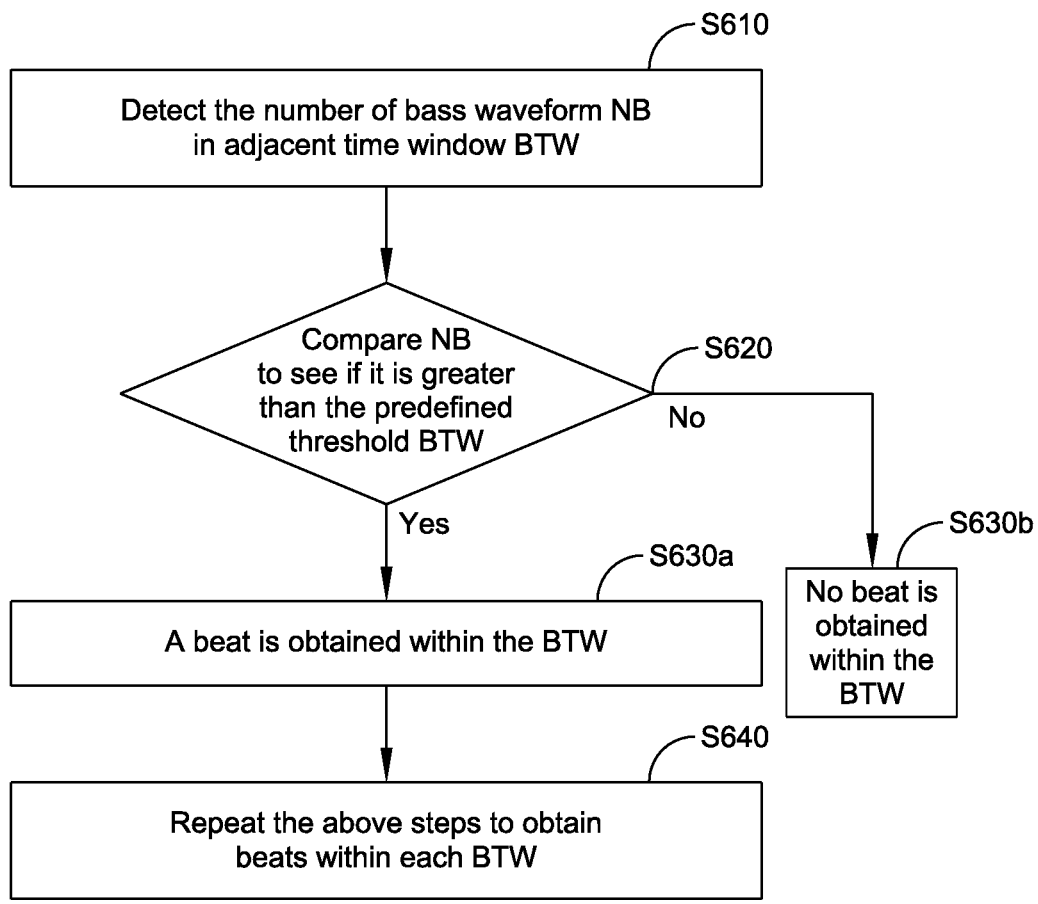
FIG. 3 is a more detailed block diagram and flow chart related to one of the steps illustrated in FIG. 1.
Figure 4:
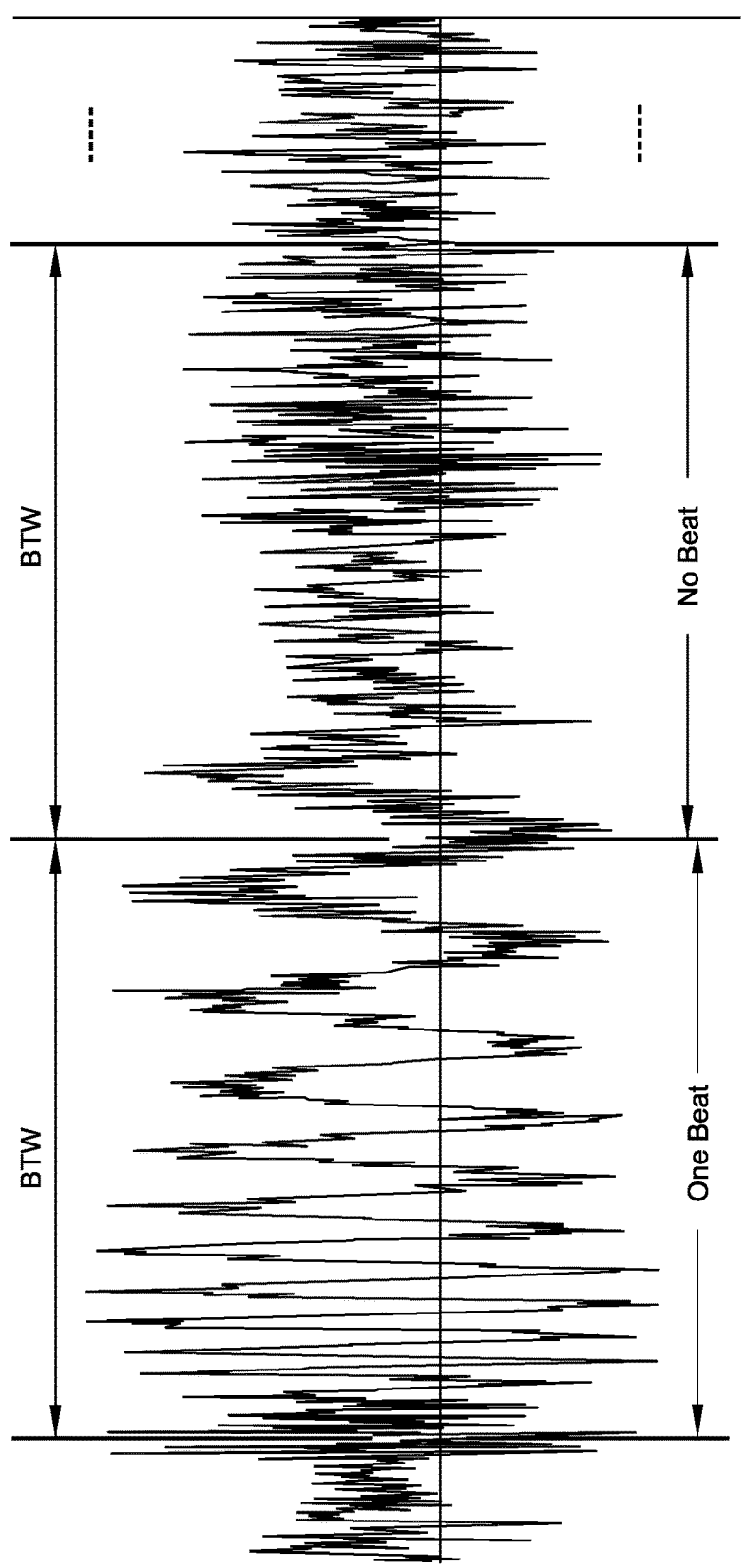
FIG. 4 is an audio signal waveform of one of the steps indicated in FIG. 1 indicating that there is a beat in the first BTW interval, while there is no beat in the second BTW interval.
Figure 5:
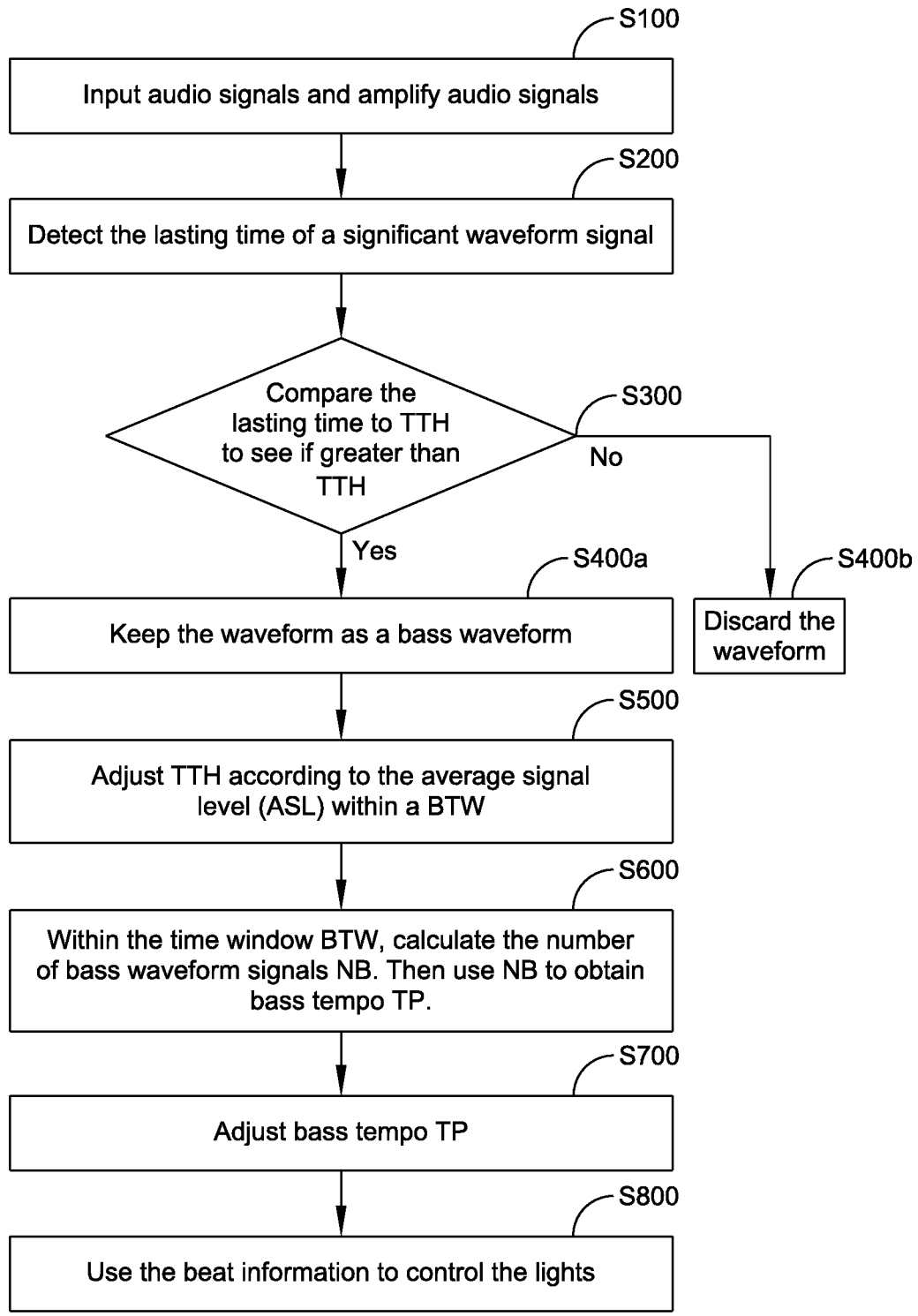
FIG. 5 is a somewhat more detailed block diagram and flow chart showing that, after detecting if a beat exists within each BTW interval, the tempo is calculated and used for adjustment in a certain range.
Figure 6:
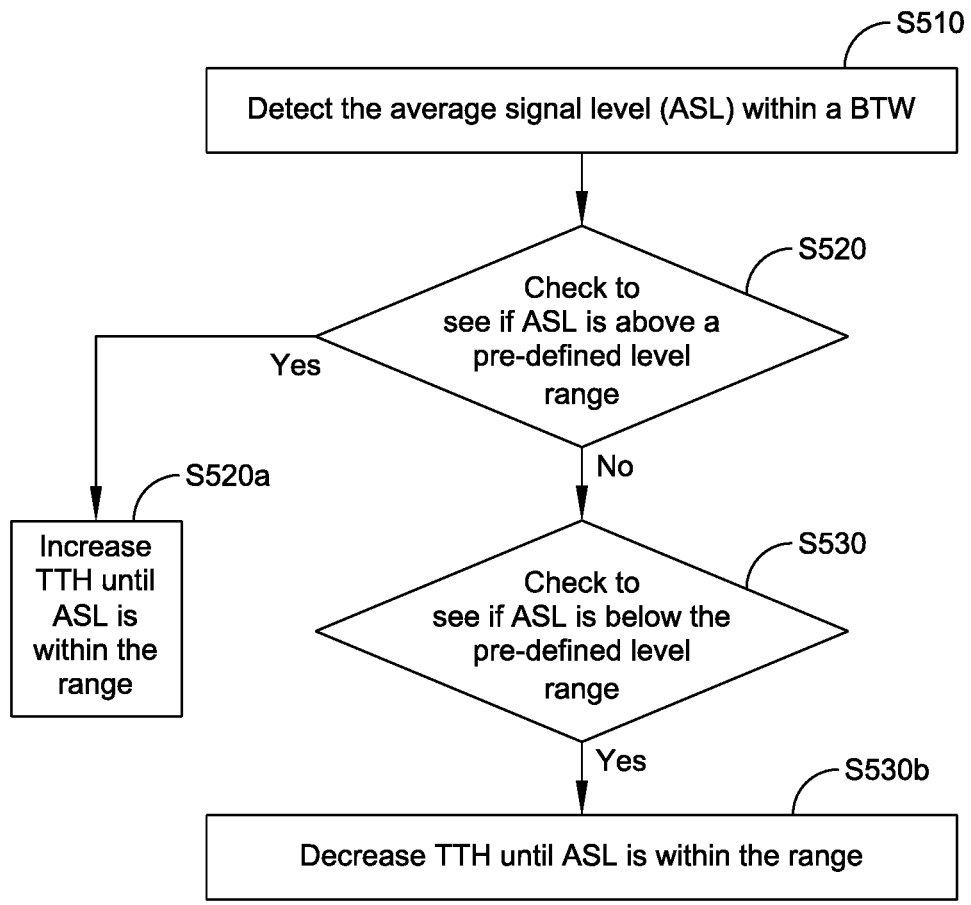
FIG. 6 is a further block diagram and flow chart showing further details of the block S500 in FIG. 5 and pertaining to adjusting TTH according to the input audio signal level.
Figure 7:
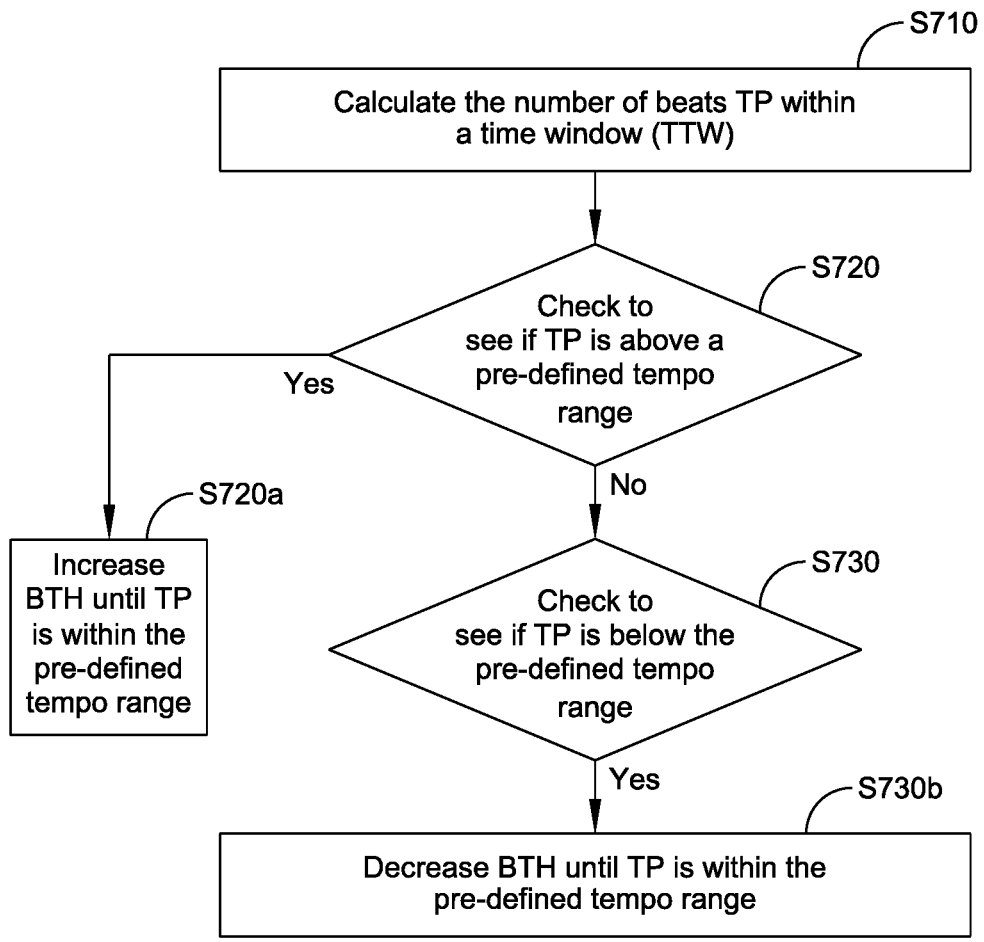
FIG. 7 is a further block diagram and flow chart showing further details of the block S700 in FIG. 5 and pertaining to adjusting the base tempo TP.
Figure 8:
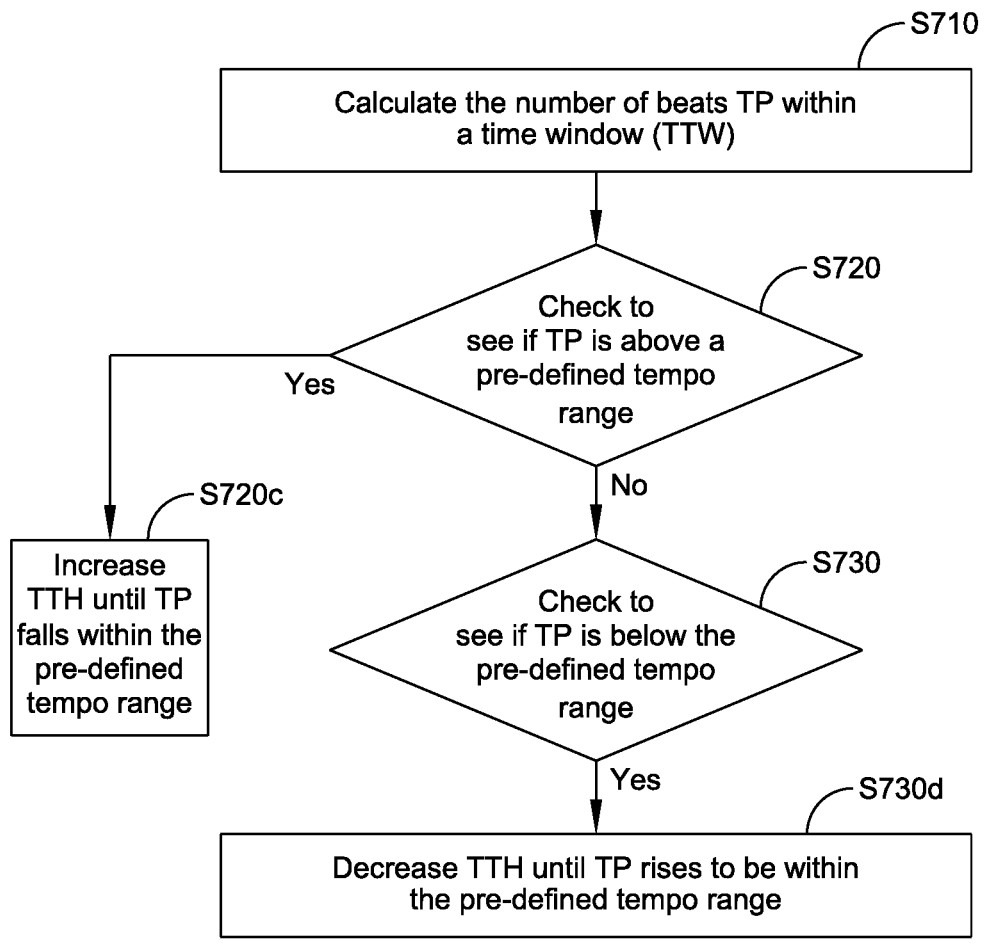
FIG. 8 is an additional block diagram and flow chart like that shown in FIG. 7 wherein TTH is adjusted to assist the tempo so as to fall within the pre-defined range.
Figure 9:
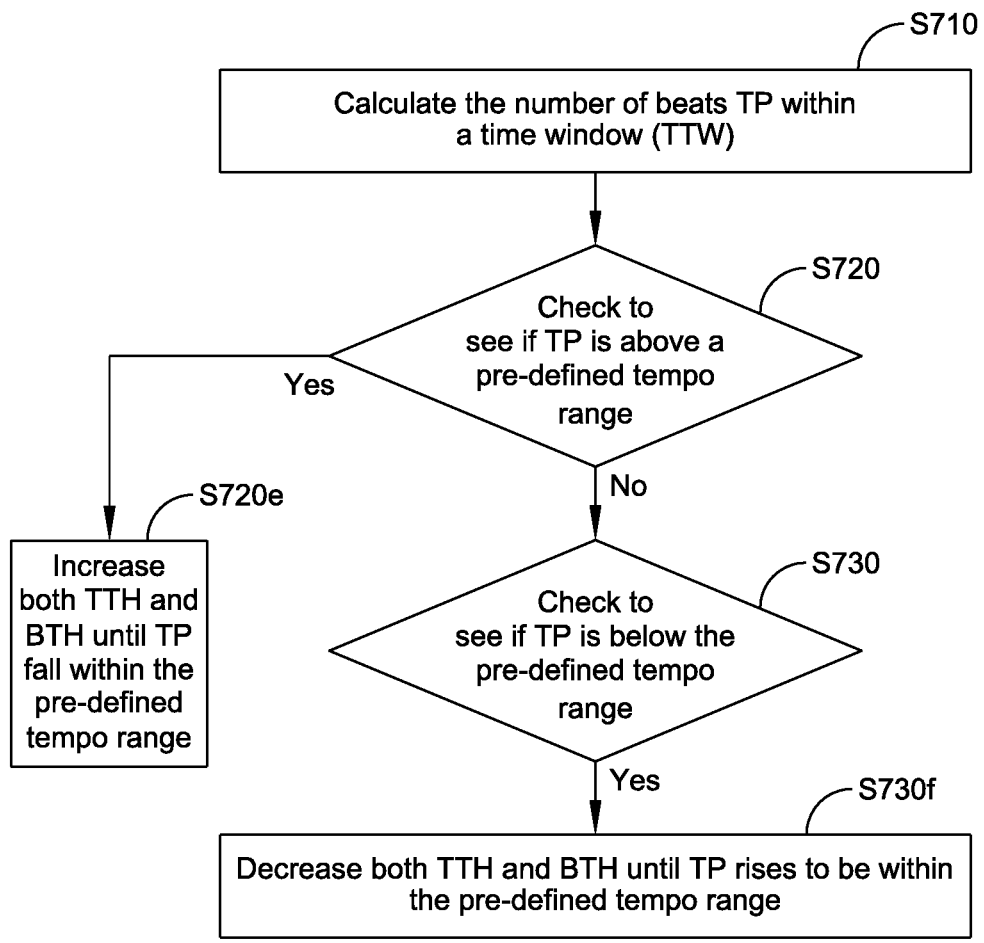
FIG. 9 is an additional block diagram and flow chart like that shown in FIG. 7 wherein both parameters BTH and TTH are adjusted to assist so that the tempo fall within the pre-defined range.
Figure 10:
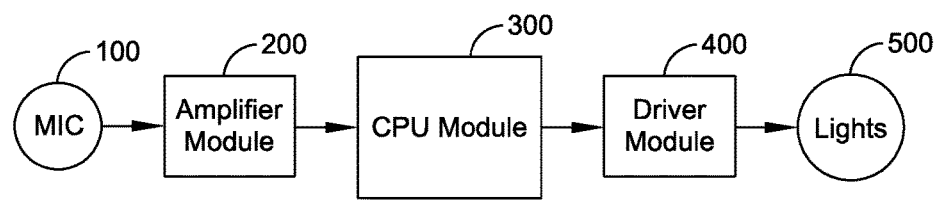
FIG. 10 is circuit block diagram that describes the concepts of the present invention.
Figure 11:
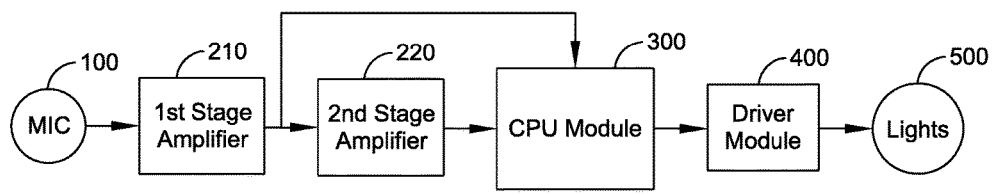
FIG. 11 is circuit block diagram like that shown in FIG. 10 but adding the use of series connected pre-amplifiers.

Reference is now made to all the figures used in describing the method and system of the present invention. In this regard, FIG. 1 is a general block diagram and flow chart that describe algorithms of the present invention. FIG. 2 is an audio signal waveform of one of the steps indicated in FIG. 1 and that is helpful in understanding the concepts of the present invention as it relates to the time window (BTW). FIG. 3 is a more detailed block diagram and flow chart related to one of the steps illustrated in FIG. 1. FIG. 4 is an audio signal waveform of one of the steps indicated in FIG. 1 indicating that there is a beat in the first BTW interval, while there is no beat in the second BTW interval. FIG. 5 is a somewhat more detailed block diagram and flow chart showing that, after detecting if a beat exists within each BTW interval, the tempo is calculated and used for adjustment in a certain range. FIG. 6 is a further block diagram and flow chart showing further details of the block S500 in FIG. 5 and pertaining to adjusting TTH according to the input audio signal level. FIG. 7 is a further block diagram and flow chart showing further details of the block S700 in FIG. 5 and pertaining to adjusting the base tempo TP. FIG. 8 is an additional block diagram and flow chart like that shown in FIG. 7 wherein TTH is adjusted to assist the tempo so as to fall within the pre-defined range. FIG. 9 is an additional block diagram and flow chart like that shown in FIG. 7 wherein both parameters BTH and TTH are adjusted to assist so that the tempo fall within the pre-defined range. FIG. 10 is circuit block diagram that describes the concepts of the present invention. FIG. 11 is circuit block diagram like that shown in FIG. 10 but adding the use of series connected pre-amplifiers.

Figure 12:
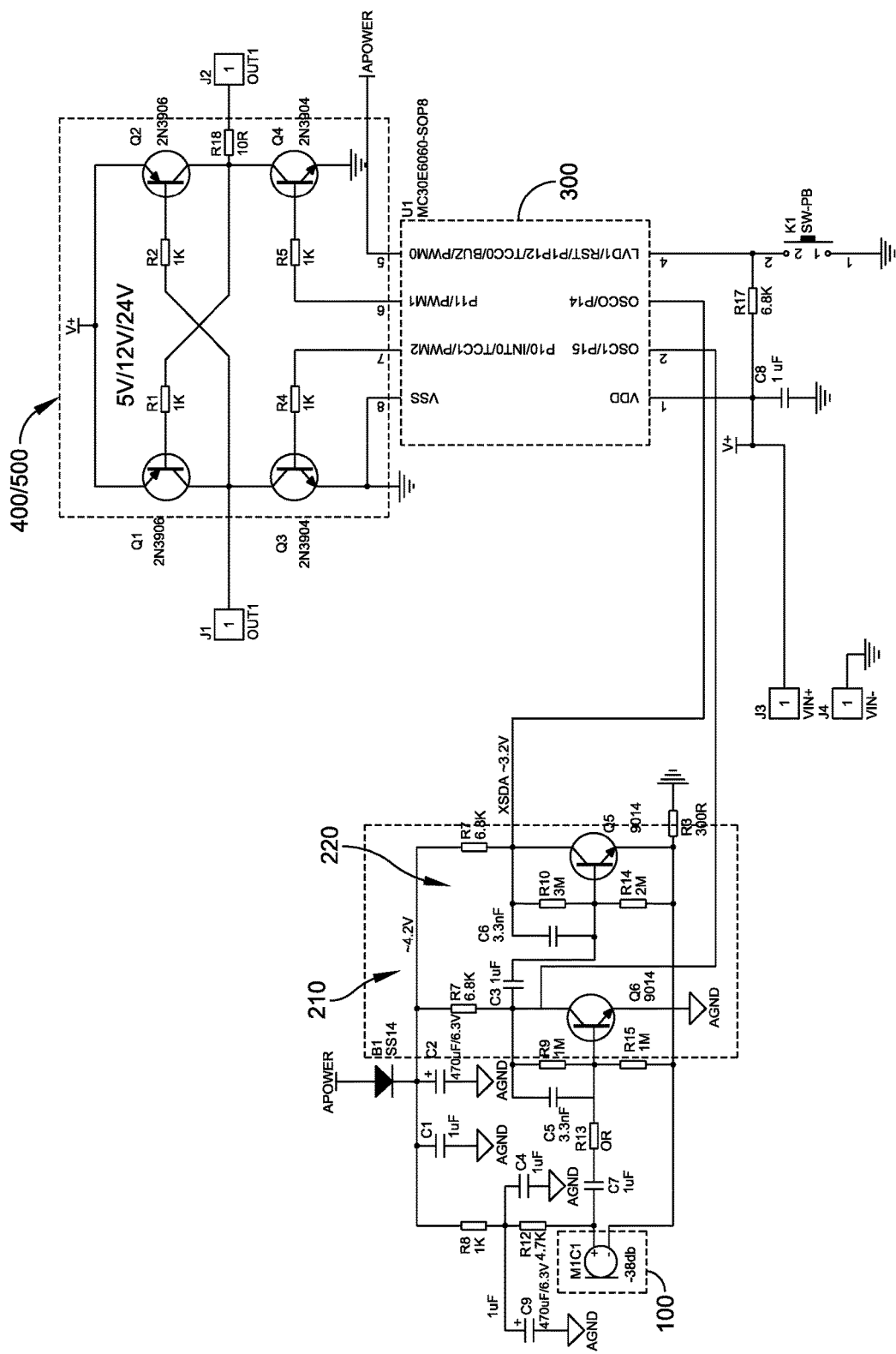
FIG. 12 is a more detailed circuit diagram of the block diagram of FIG. 11.

FIG. 12 is a more detailed circuit diagram of the block diagram of FIG. 11. In FIG. 12 it is noted that the same reference characters are used as previously described in FIG. 11. FIG. 12 simply provides further specific circuits particularly for the two pre-amplifiers 210 and 220.

FIG. 13 is a block diagram illustrating a possible alternate arrangement of the pre-amplifiers. In FIG. 13 several of the same reference characters are used as previously described in the block diagram of FIG. 11. However, in FIG. 13 there is an added control member 110 that may be in the form of an electronic switch controlled from the algorithm 120 so as to couple input audio signals from the microphone 100 to either of the respective pre-amplifiers 210, 220.

FIG. 1 in particular describes one aspect of the process of the present invention, as follows:

Step S100: Input audio signals and amplify audio signals. In this step, a high sensitivity microphone and a two stage pre-amplifier are used to achieve a high sensitivity of up to 65 db.

Step S200: From the amplified signals detect any waveform with a level greater than a predefined level threshold MO and calculate the lasting time (T1) for each continuous waveform signal 10, as shown in the representative audio waveform shown in FIG. 2.

Step S300: Compare the lasting time (T1) to TTH; if T1 is greater than TTH, go to step S400a; if not, go to step S400b. As shown in FIG. 2, TTH is used to distinguish between bass signals or non-bass signals. As the bass signal has a longer wave length, when T1 is greater than TTH, the signal is regarded as a bass waveform.

Step S400a: Keep the waveform signal as one bass waveform signal.

Step S400b: Discard this waveform signal.

Step S600: Within the time window BTW (see the audio waveform of FIG. 2), calculate the number of bass waveform signals NB. Then use NB to obtain bass tempo TP. When the number of bass waveform signals is greater than a predefined number called the beat threshold BTH, a beat is detected.

Step S800: Use the beat information to control the lights. For Step S600 in FIG. 1 refer to the flow block chart of FIG. 3. As depicted in FIG. 3, to calculate the number of bass waveform signals NB within the time window BTW, the following steps are employed.

Step S610: Detect the number of bass waveforms NB in adjacent time windows BTW.

Step S620: Compare NB to see if it is greater than the predefined threshold BTH; if yes, go to step S630a; if not, go to step S630b.

Step 630a: A beat is obtained within the BTW.

Step 630b: No beat is obtained within the BTW.

Step S640: Repeat the above steps to obtain beats within each BTW.

In the example waveform shown in FIG. 4, there is a beat in the first BTW interval, while there is no beat in the second BTW interval.

Refer now to the flow charts or block diagrams in FIGS. 5-9. As shown in FIG. 5, before calculating NB to obtain the beats, more steps are taken to detect bass waveform signals. In FIG. 5 the first series of steps are as set forth in FIG. 1 through step S400a. Thereafter the steps are as follows:

Step S500: Adjust TTH according to the average signal level (ASL) within a BTW interval. This is to prevent the bass signals from being missed when signal level (ASL) is low and to prevent non-bass signals from being mistaken as bass signals when signal level (ASL) is high.

Step S600: Within the time window BTW (see the audio waveform of FIG. 2), calculate the number of bass waveform signals NB. Then use NB to obtain bass tempo TP.

Step S700: Adjust the base tempo TP.

Step S800: Use the beat information to control the lights.

As shown in FIG. 5, after detecting if a beat exists within each BTW interval, the tempo is calculated and used for adjustment. The purpose of the adjustment is to obtain a tempo which is used for controlling the lights to be within a certain range. If the tempo is too fast, the lights will change too quickly. It the tempo is too slow, the lights will change too slowly.

As shown in FIG. 6, the steps for adjusting TTH according to signal level are, as follows:

Step S510: Detect the average signal level (ASL) within a BTW interval;

Step S520: Check to see if ASL is above a pre-defined level range; if yes, go to Step S520a; if not, go to Step S530.

Step S520a: Increase TTH until ASL is within the range.

Step S530: Check to see if ASL is below the pre-defined level range; if yes, go to Step S530b Step S530b: Decrease TTH until ASL is within the range.

The flow chart in FIG. 7 includes the steps, as follows:

Step S710: Calculate the number of beats TP within a time window (TTW);

Step S720: Check to see if TP is above a pre-defined tempo range; if yes, go to Step S720a; if not, go to Step S730.

Step S720a: Increase BTH until TP is within the pre-defined tempo range.

Step S730: Check to see if TP is below the pre-defined tempo range; if yes, go to Step S730a Step S730a: Decrease BTH until TP is within the pre-defined tempo range.

As shown in FIG. 8, TTH is adjusted to help the tempo fall within the pre-defined range. The control steps are, as follows:

Step S710: Calculate the number of beats TP within a time window (TTW);

Step S720: Check to see if TP is above a pre-defined tempo range; if yes, go to Step S720c; if not, go to Step S730.

Step S720c: Increase TTH until TP falls within the pre-defined tempo range.

Step S730: Check to see if TP is below the pre-defined tempo range; if yes, go to Step S730d Step S730d: Decrease TTH until TP rises to be within the pre-defined tempo range.

As shown in FIG. 9, both parameters BTH and TTH are adjusted to help the tempo fall within the pre-defined range. The control steps are, as follows:

Step S710: Calculate the number of beats TP within a time window (TTW);

Step S720: Check to see if TP is above a pre-defined tempo range; if yes, go to Step S720e; if not, go to Step S730.

Step S720e: Increase both TTH and BTH until TP falls within the pre-defined tempo range.

Step S730: Check to see if TP is below the pre-defined tempo range; if yes, go to Step S730f Step S730f: Decrease both TTH and BTH until TP rises to be within the pre-defined tempo range.

Thus, in accordance with the present invention and with the above characteristics taken into account, the following are important parameters and associated controls thereof.

A. Adjusting TTH and BTH based upon tempo TP. [see paragraphs 1) and 2) above in The Invention] TTH is a short time period that is for frequency analysis. It is used to detect the low frequency waveform. BTH is to determine if enough low frequency continuous waveforms are detected. If enough, it is treated as a beat.

B. Adjusting TTH based upon magnitude M. [see paragraphs 3) above in The Invention]

C. Changing pre-amplifiers as an input to the MCU, based upon the level of sensed magnitude M and/or the level of tempo T. [see paragraph 4) above in The Invention]

Reference is now made to the circuit diagram of FIG. 10 which shows the basic components of the control circuit of the present invention. There is illustrated in FIG. 10 a system for controlling lights 500 that may be comprised of a plurality of light sources particularly LED's that are provided in a number of different arrangements including a light string and controlled from a CPU module 300. The circuit of FIG. 10 also includes an input microphone 100 for detecting an audio signal, an amplifier module 200 that includes at least one pre-amplifier, the MCU unit receiving signals from the pre-amplifier module, and a driver module 400 that includes a circuit for driving a plurality of LED and that enables lighting control of the plurality of LED's in accordance with the input audio signal and within a wide dynamic range.

Reference is now made to the circuit diagram of FIG. 11 which supplements the diagram of FIG. 10 by providing more detail, in particular, of the amplifier module 200 as comprised of a pair of pre-amplifiers, identified in FIG. 11 as a first stage amplifier 210 and a second stage amplifier 220 that are connected in series so as to provide a total amplification that is additive. The pair of amplifiers 210, 220 is connected from the microphone 100 to the CPU module 300. When the circuit is functioning normally the total amplification is used. This has been referred to as the default state wherein the additive amplification of both pre-amplifiers occurs. The MCU 300 also keeps track of the level of both magnitude M and tempo TP received at the MCU. A certain threshold for the value of both the magnitude M and the tempo TP is determined at the MCU. It has been found that if that predetermined threshold is exceeded then a better dynamic range is attained if the amplification is essentially lowered if that threshold is exceeded. The amplification is lowered by, instead of receiving the full amplification from pre-amplifiers 210 and 220 connected in series, the MCU 300 essentially switches in order to receive the input from only the pre-amplifier 210 (lower amount of amplification) by way of the direct connection line 230 from the first stage amplifier 210 to the CPU module 300. This output light control changes the light output once the threshold is reached, thus providing a more effective light output. The control can involve sensing both magnitude M and tempo TP in order to control light output, or either of the magnitude M or tempo TP can be used to control the signals from per-amplifiers 210 and 220.

There are a number of important features of the present invention, as well as several different embodiments that the invention can assume. The system detects a wide range of sounds creating a lighting affect that may be in the form of a light show that is unique to the background music that is being played. There are preferable four modes of operation including the light show; a steady "on" condition; a slow pulse mode and a blinking mode. The device is preferably battery operated requiring only three small batteries such as AA batteries. The microphone is high sensitivity to provide a wide range of sounds from 65 db to 110 db. If used as a light string it is easy to shape, able to bend around railings, useable as a garland or a table top decoration. The basic control box that is used is relatively small including an on/off and mode button. The button can be pressed to change modes per the above. The main mode is with the light affect wherein the array of LED's is controlled from the played music which can be provided from virtually any audio source. To turn the device off one simply can hold the button down until the light array goes off.

One of the preferred embodiments of the present invention is in the form of an LED light string. In this regard there are considered to be 5 patterns that react to music: chase, shine, wave, strobe and Twinkle. In this light string embodiment the LEDs in the strings are organized in two channels: Channel A and B. They are lined up alternatively: ABABA-BAB . . . . Here are the following controls:

1) Chase—A/B chase is activated by beats. When A is ON, B is OFF. When B is ON, A is OFF.
2) Shine—Both A and B shine brighter with the beats
3) Wave—A shines brighter with the beats but B shines dimmer with beats
4) Strobe—B shines brighter with the beats, A becomes strobe lights
5) Twinkle—Both A and B shine dimmer with the beats For example in strobe pattern, beat (B) and magnitude (M) are used to control channel B. Beat (B) and tempo (TP) are used to control channel A. The strobe light mode provides a few flashes in a short period of time. The strobe light is not turned on for each beat, but instead it is turned on once every predetermined number of beats.

The light string, as mentioned before, has an alternating pattern; meaning that separate wiring control is provided to the spaced apart LEDs. One set of wires controls channel A and a separate setoff wires controls channel B. In that way there is provided improved light control. Thus, in the light string of LEDs a first LED in the light string is controlled via a first channel A, while a second LED in the light string is controlled via a second channel B, and in turn a third LED in the light string is controlled via the same first channel A, etc. Thus, alternating LEDs are controlled from these respective channels which are, in turn, controlled from the LED driver 18. One example is when the control is in the "chase" mode so that when the LEDs of channel A are illuminated, the LEDs of channel B are turned off. Alternatively, when the LEDs of channel B are illuminated, the LEDs of channel A are turned off. This occurs in a repetitive manner to provide a chase light sequence.

The following are also important aspects of the present invention:

a) Sound decibel range, the system of the invention can automatically adjust the follow up from low decibel to high decibel sound, but without any errors. The market sound effective LED glasses will need to manually switch sound range between low and high level.

b) Beat follow sense, the system of the invention will follow beats as priority music, but not just follow the sound/music. In other words it can tell the beats from the music.

c) 5 patterns for the light show model as mentioned before. The system of the invention has the 5 different music patterns follow light up version, by different lightness levels or an LED combination arrangement.

Having now described a limited number of embodiments of the present invention, it should now be apparent to those skilled in the art that numerous other embodiments and modifications thereof are contemplated as falling within the scope of the present invention, as defined by the appended claims.

What is claimed is:

1. A system for lighting control using sound, comprising:
a microphone for receiving audio signals,
a preamplifier for amplifying said audio signals,
a controller for detecting bass beat information from said audio signals and adjusting beat information in order to control lights,
a light driver for driving the lights, and
a plurality of LEDS connected in a light array,
wherein the light array is controlled from separate control channels A and B, using one of the following to be selected;
   I) Chase—A/B chase is activated by beats, when A is ON, B is OFF; when B is ON, A is OFF
   ii) Shine—Both A and B shine brighter with the beats
   iii) Wave—A shines brighter with the beats but B shines dimmer with beats
   iv) Strobe—B shines brighter with the beats, A becomes strobe lights
   v) Twinkle—Both A and B shine dimmer with the beats.

2. The system of claim 1 wherein the preamplifier includes a pair of first and second preamplifiers connected in series.

3. The system of claim 2 wherein, in a first mode of operation both preamplifiers provide additive amplification of an input audio signal.

4. The system of claim 3 wherein, in a second mode of operation, only the first preamplifier provides amplification of an input audio signal.

* * * * *

UNITED STATES PATENT AND TRADEMARK OFFICE
CERTIFICATE OF CORRECTION

PATENT NO. : 10,492,277 B2  
APPLICATION NO. : 16/213102  
DATED : November 26, 2019  
INVENTOR(S) : Zhang Page 1 of 1

It is certified that error appears in the above-identified patent and that said Letters Patent is hereby corrected as shown below:

On the Title Page

Insert item (30):  
--(30) Foreign Application Priority Data  
Dec. 12, 2017 [CN] China 2017113216417--

Signed and Sealed this  
Twelfth Day of May, 2020

Andrei Iancu  
*Director of the United States Patent and Trademark Office*